US009869714B2

(12) United States Patent
Johnson et al.

(10) Patent No.: US 9,869,714 B2
(45) Date of Patent: *Jan. 16, 2018

(54) INTEGRATED CIRCUIT TEST TEMPERATURE CONTROL MECHANISM

(71) Applicant: INTEL CORPORATION, Santa Clara, CA (US)

(72) Inventors: John C. Johnson, Phoenix, AZ (US); James G. Maveety, Campbell, CA (US); Abram M. Detofsky, Tigard, OR (US); James E. Neeb, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/185,468

(22) Filed: Jun. 17, 2016

(65) Prior Publication Data

US 2016/0291083 A1    Oct. 6, 2016

Related U.S. Application Data

(62) Division of application No. 13/600,486, filed on Aug. 31, 2012, now Pat. No. 9,400,291.

(51) Int. Cl.
| | |
|---|---|
| *G01R 31/00* | (2006.01) |
| *G01R 31/28* | (2006.01) |
| *G01R 1/44* | (2006.01) |
| *H05K 7/20* | (2006.01) |
| *G01R 1/067* | (2006.01) |
| *G01R 31/26* | (2014.01) |
| *G01R 1/04* | (2006.01) |

(52) U.S. Cl.
CPC ..... *G01R 31/2874* (2013.01); *G01R 1/06722* (2013.01); *G01R 1/06783* (2013.01); *G01R 1/44* (2013.01); *G01R 31/2875* (2013.01);
*G01R 31/2891* (2013.01); *H05K 7/20* (2013.01); *G01R 1/0458* (2013.01); *G01R 31/2642* (2013.01)

(58) Field of Classification Search
CPC .... G01R 1/44; G01R 1/0458; G01R 31/2874; G01R 1/06783; G01R 1/06722; G01R 1/073; G01R 21/133; G01R 31/2648; H05K 7/20
USPC ............ 324/750.01, 750.03, 750.04, 750.05, 324/750.06, 750.07, 750.11, 760, 765
See application file for complete search history.

(56) References Cited

U.S. PATENT DOCUMENTS

| | | |
|---|---|---|
| 5,205,132 A | 4/1993 | Fu |
| 6,788,084 B2 | 9/2004 | Jones et al. |
| 6,956,390 B1 | 10/2005 | Feltner et al. |
| 7,483,769 B2 | 1/2009 | Hoover |

(Continued)

OTHER PUBLICATIONS https://web.archive.org/web20101204145052/http://www.danfoss.com/North_America/Products/Categories/Group/HE-HEC/THermostatic-Heating-and-Cooling-Climate-Controls/Thermo-Hydraulic-Electronic-Actuators-for-HealingCooling-Application/f0daf8a5-82c1-4a77-a743-1d9b1baa3edb.html—Thermo-Hydraulic Electronic Actuators for Healing/Cooling Applications.

*Primary Examiner* — Huy Q Phan
*Assistant Examiner* — Raul Rios Russo
(74) *Attorney, Agent, or Firm* — Schwabe Williamson & Wyatt P.C.

(57) ABSTRACT

A thermal controller includes a thermal control interface to receive test data from an automated test equipment (ATE) system and dynamically adjust a target setpoint temperature based on the data and a dynamic thermal controller to receive the target setpoint temperature from the thermal control interface and control a thermal actuator based on the target setpoint temperature.

12 Claims, 5 Drawing Sheets

(56) References Cited

U.S. PATENT DOCUMENTS

| | | |
|---|---|---|
| 7,792,597 B2 | 9/2010 | Brey et al. |
| 7,822,586 B2 | 10/2010 | Wu et al. |
| 2002/0014894 A1 | 2/2002 | Yonezawa et al. |
| 2002/0050833 A1* | 5/2002 | Jones ................ G01R 31/2874 324/750.09 |
| 2003/0001605 A1* | 1/2003 | Jones ................ G01R 31/2874 324/750.09 |
| 2005/0007136 A1* | 1/2005 | Feder ............... H01L 21/67248 324/750.05 |
| 2005/0224492 A1 | 10/2005 | Roy |
| 2005/0267645 A1 | 12/2005 | Fenk |
| 2006/0052970 A1* | 3/2006 | Arabi ..................... G06F 1/206 702/132 |
| 2006/0152238 A1* | 7/2006 | Beaman ............ G01R 31/2874 324/750.08 |
| 2007/0267188 A1* | 11/2007 | Di Stefano ........ G05D 23/1393 165/296 |
| 2008/0161978 A1 | 7/2008 | Shah |
| 2011/0226442 A1* | 9/2011 | Tustaniwskyj ..... G01R 31/2874 165/47 |
| 2013/0285686 A1 | 10/2013 | Malik et al. |

* cited by examiner

INTEGRATED CIRCUIT TEST TEMPERATURE CONTROL MECHANISM

CLAIM OF PRIORITY

This application is a divisional application of U.S. patent application Ser. No. 13/600,486, filed Aug. 31, 2012, entitled INTEGRATED CIRCUIT TEST TEMPERATURE CONTROL MECHANISM, by John C. Johnson, et al., now allowed, the benefit of and priority to which are claimed thereof and the entire contents of which are incorporated herein by reference.

FIELD OF THE INVENTION

The present disclosure generally relates to integrated circuits, and more particularly, to testing integrated circuits.

BACKGROUND

Integrated circuits (ICs) are designed to operate under a variety of environmental conditions. For example, ICs are designed to operate over a range of temperatures. To ensure that an IC operates correctly over a particular range of temperatures, the IC is coupled to a test unit for testing at different temperatures within the particular range. The test unit typically includes a thermal unit that facilitates thermal heating/cooling and control for testing.

Current thermal systems that control device temperature during testing implement a traditional approach by attempting to control to a fixed temperature setpoint. However, modern complex IC devices have diverse thermal management requirements during testing. Such requirements include an accurate, stable, fixed temperature with near isothermal conditions calibrating the device's built in temperature sensors, a rapidly responding temperature control to minimize device temperature changes while device power is changing dynamically during a test, and different target test temperatures depending on the product's inherent performance and targeted application. The change in target temperature is on a device by device basis and actually changes as the device test flow is progressing.

Additionally, there may be a need to change test temperature on an IC while the device is in a test socket in order to accommodate new test applications. For example, during hot testing, test data may indicate the need for the device to also be tested at a cold test temperature to adequately screen for possible defect types. A device test socket may include stress screening at temperatures that are elevated relative to the testing temperature.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Figure 1:
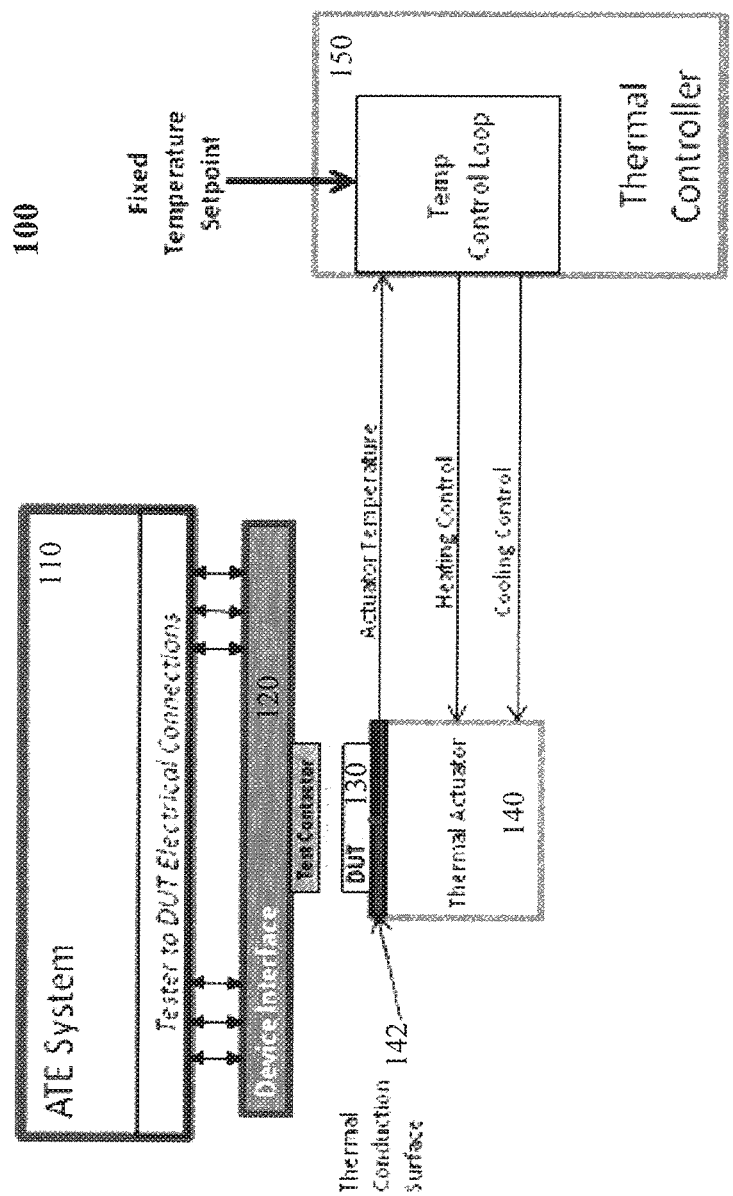
FIG. 1 illustrates a conventional test system.

FIG. 1 illustrates a conventional test system 100. System 100 includes an automated test equipment (ATE) system 110 implemented to perform thermal testing on a device under test (DUT) 130. DUT 130 may be an IC die on a wafer, or a packaged part. In one embodiment, ATE system 110 is coupled to DUT 130 via a device interface 120 and test contactor.

System 100 also includes a thermal actuator 140 having a conduction surface 142. Thermal actuator 140 is used to physically heat or cool the temperature of DUT 130 during testing. A thermal controller 150 is electrically coupled to actuator 140 to control the temperature of DUT 130 via actuator 140. Thus, thermal controller 150 transmits heating and cooling control signals to actuator 140 in order to maintain DUT 130 at a fixed setpoint temperature based on feedback temperature of conduction surface 142 received from actuator 140.

Figure 2A:
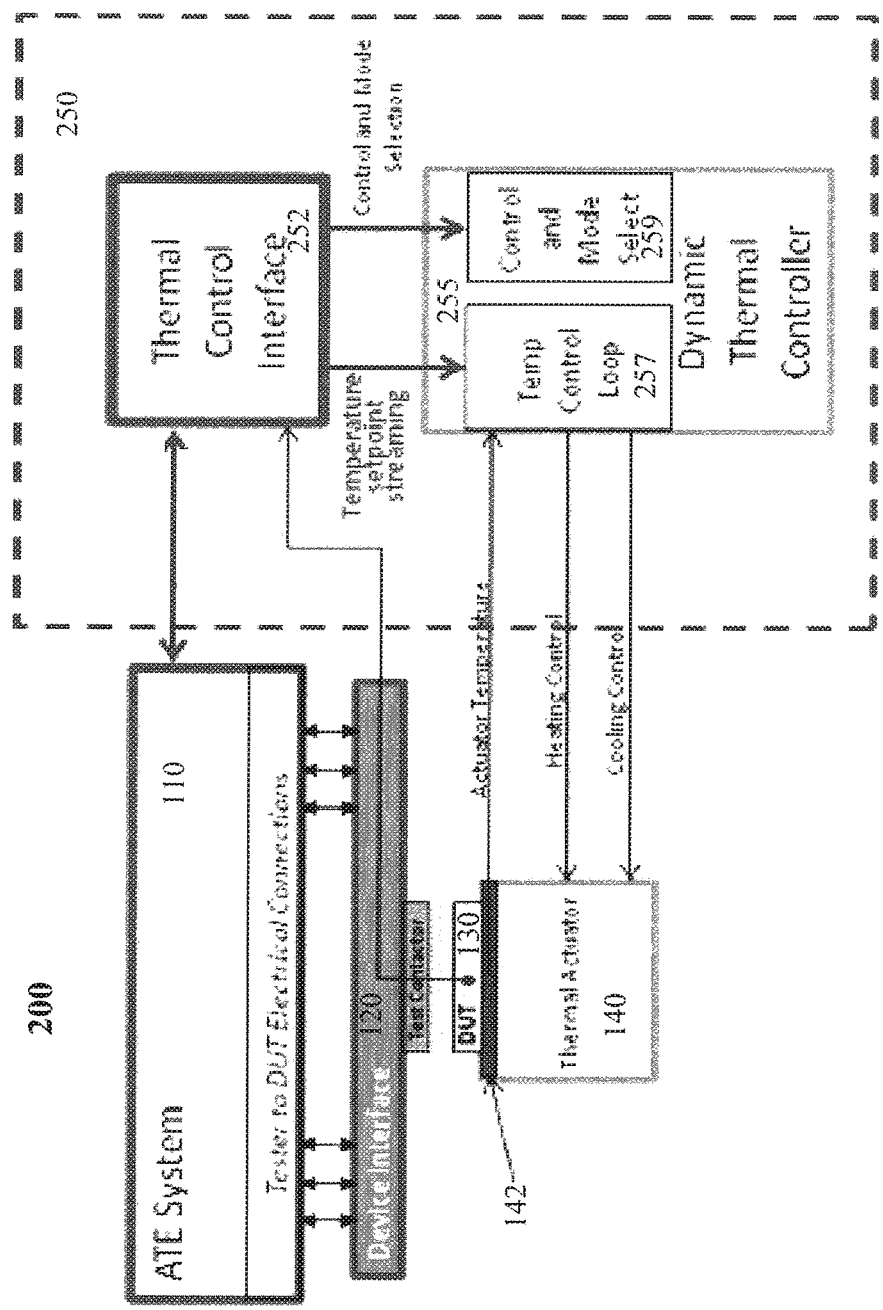
FIGS. 2A and 2B illustrate embodiments of a test system.

As discussed above, there are limitations to systems like test system 100, which attempt to control to a fixed temperature setpoint. Thus, according to one embodiment, a test system is disclosed that provides dynamic control inputs as well as the traditional test features. FIG. 2A illustrates one embodiment of a test system 200. As shown in FIG. 2A, test system 200 includes similar features to system 100 discussed above. However in this embodiment, a thermal controller 250 is coupled to thermal actuator 140 for thermal management of DUT 130.

Thermal controller 250 includes a thermal control interface (TCI) 252 and a dynamic thermal controller (DTC) 255. In one embodiment, TCI 252 is electrically coupled to ATE system 110 to translate inputs from the ATE system 110 in order to dynamically adjust a target temperature setpoint based on various test related conditions and test program commands.

In one embodiment, DTC 255 controls thermal actuator 140 using a fast response control loop that accepts a streaming dynamic temperature setpoint value from the TCI 252. In such an embodiment, TCI 252 receives the feedback temperature from actuator 140 and transmits streaming temperature setpoint data to a temperature control loop module 257 within DTC 255 via a digital interface.

Figure 3:
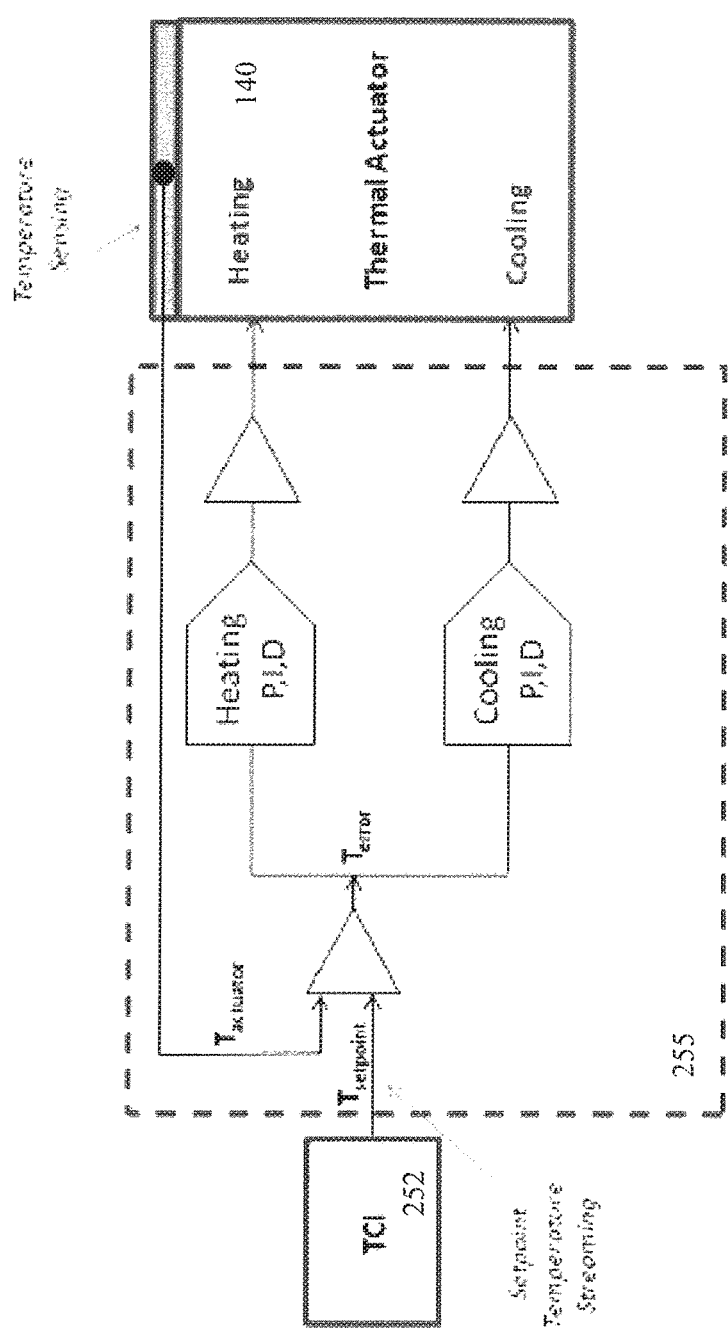
FIG. 3 illustrates another embodiment of a test system.

FIG. 3 illustrates one embodiment of a control loop performed by DTC 255, in which a traditional proportional-integral-derivative (PID) control methodology is used. For fast control response, DTC 255 may operate at a rate that is much faster than the time constant of the actuator 140 temperature response and also faster than the temperature streaming update rate.

DTC 255 also includes a control and mode select module coupled to the digital interface to select a mode of operation (e.g., traditional static or dynamic mode) for DTC 255. In one embodiment, the interface is implemented with a simple protocol two-wire interface such as the Inter-Integrated Circuit (I$^2$C) interface.

Figure 2B:
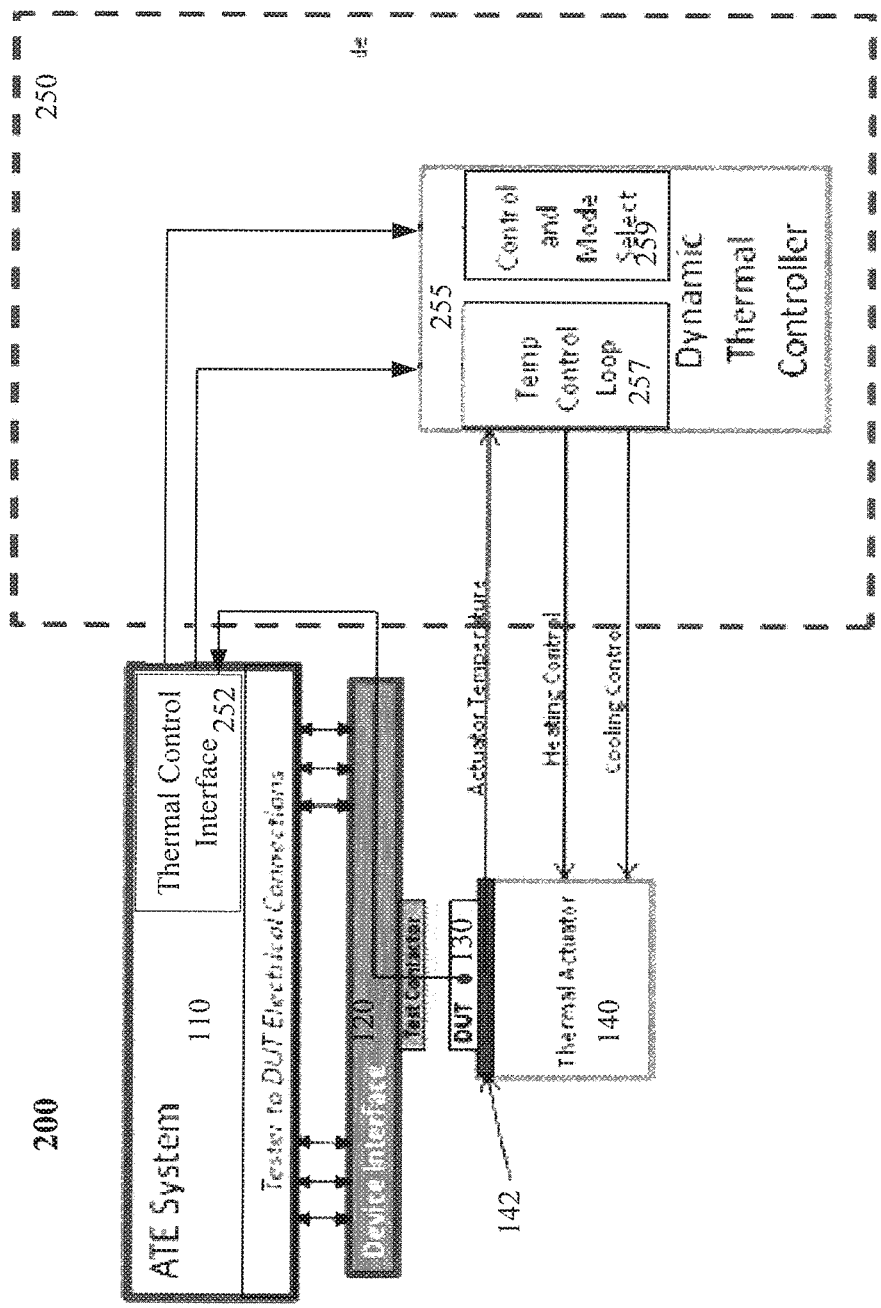

However other interfaces (e.g., SPI, RS-422, etc.) may be implemented in other embodiments. In such an embodiment, a flexible digital communications protocol using simple commands (defined headers in the case of a serial protocol) is implemented for command/control and temperature streaming busses. FIG. 2B illustrates another embodiment of a test system 200 in which TCI 252 is included within ATE system 110, rather than thermal controller 250.

In both embodiments DTC 255 is responsible for controlling to the setpoint temperature and maintaining control of actuator 140. Additionally, DTC 255 is responsible for avoiding any conditions that might damage actuator 140 or the control system.

The above-described mechanism provides independent modular control components that enable matching various thermal control solutions with various ATE test applications by providing temperature in a streaming protocol. Moreover, the mechanism avoids complicated schemes to align and calibrate scaled analog signals between systems.

Figure 4:
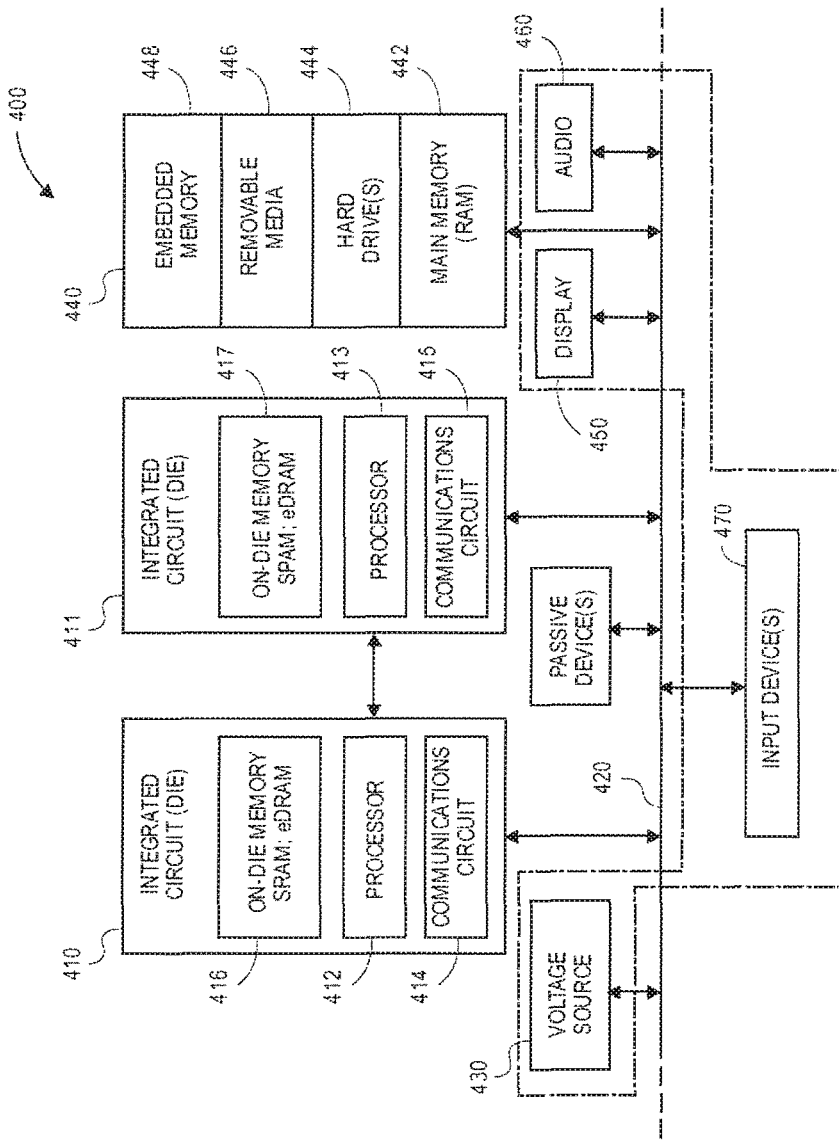
FIG. 4 illustrates one embodiment of a computer system.

FIG. 4 illustrates one embodiment of a computer system 400. The computer system 400 (also referred to as the electronic system 400) as depicted can embody a test system that includes a thermal controller having a thermal control interface to receive test data from an automated test equipment (ATE) system and dynamically adjust a target setpoint temperature based on the data and a dynamic thermal controller to receive the target setpoint temperature from the thermal control interface and control a thermal actuator based on the target setpoint temperature.

The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be a server system. The computer system 400 may be a supercomputer or high-performance computing system.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 610 through the system bus 420.

The integrated circuit 410 is electrically coupled to the system bus 420 and includes any circuit, or combination of circuits according to an embodiment. In an embodiment, the integrated circuit 410 includes a processor 412 that can be of any type. As used herein, the processor 412 may mean any type of circuit such as, but not limited to, a microprocessor, a microcontroller, a graphics processor, a digital signal processor, or another processor. In an embodiment, the processor 412 includes a thermal controller having a thermal control interface to receive test data from an automated test equipment (ATE) system and dynamically adjust a target setpoint temperature based on the data and a dynamic thermal controller to receive the target setpoint temperature from the thermal control interface and control a thermal actuator based on the target setpoint temperature as disclosed herein.

In an embodiment, SRAM embodiments are found in memory caches of the processor. Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems, or a communications circuit for servers. In an embodiment, the integrated circuit 410 includes on-die memory 416 such as static random-access memory (SRAM). In an embodiment, the integrated circuit 410 includes embedded on-die memory 416 such as embedded dynamic random-access memory (eDRAM).

In an embodiment, the integrated circuit 410 is complemented with a subsequent integrated circuit 411. Useful embodiments include a dual processor 413 and a dual communications circuit 415 and dual on-die memory 417 such as SRAM. In an embodiment, the dual integrated circuit 410 includes embedded on-die memory 417 such as eDRAM.

In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448 such as the first die in an embedded TSV die stack, according to an embodiment.

In an embodiment, the electronic system 400 also includes a display device 450, an audio output 460. In an embodiment, the electronic system 400 includes an input device such as a controller 470 that may be a keyboard, mouse, trackball, game controller, microphone, voice-recognition device, or any other input device that inputs information into the electronic system 400. In an embodiment, an input device 470 is a camera. In an embodiment, an input device 470 is a digital sound recorder. In an embodiment, an input device 470 is a camera and a digital sound recorder.

As shown herein, the integrated circuit 410 can be implemented in a number of different embodiments, including a test system that includes a thermal controller having a thermal control interface to receive test data from an automated test equipment (ATE) system and dynamically adjust a target setpoint temperature based on the data and a dynamic thermal controller to receive the target setpoint temperature from the thermal control interface and control a thermal actuator based on the target setpoint temperature, and their equivalents, an electronic system, a computer system, one or more methods of fabricating an integrated circuit, and one or more methods of fabricating an electronic assembly that includes a semiconductor die packaged according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with a thermal interface unit and their equivalents. A foundation substrate may be included, as represented by the dashed line of FIG. 4. Passive devices may also be included, as is also depicted in FIG. 4.

Although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:
1. A test system comprising:
an integrated circuit (IC) device;
a thermal actuator coupled to the IC device to change a temperature of the IC device during testing;

an automated test equipment (ATE) system coupled to the IC device and a thermal control interface, the (ATE) system is to send testing data for the IC device during testing of the thermal control interface and to dynamically adjust a target setpoint temperature for testing the IC device based on the testing data for the IC device; and a thermal controller, to control the temperature of the IC device during testing, the thermal controller including a dynamic thermal controller coupled to the thermal control interface and the thermal actuator to receive the target setpoint temperature from the thermal control interface and control the thermal actuator based on the target setpoint temperature.

2. The test system of claim 1 further comprising a digital interface coupled between the thermal control interface and the dynamic thermal controller.

3. The test system of claim 1 wherein the dynamic thermal controller receives the target setpoint temperature from the dynamic thermal controller via the digital interface as part of a real time data stream.

4. The test system of claim 1 wherein the dynamic thermal controller comprises a temperature control loop module to control loop module to control the thermal actuator.

5. The test system of claim 1 wherein the thermal control interface receives feedback from the thermal actuator and transmits the target setpoint temperature to the temperature control loop module.

6. The test system of claim 1 wherein the dynamic thermal controller further comprises a control and mode select module to enable selection of a mode of operation.

7. A method comprising:
changing, by a thermal actuator, temperature of an integrated circuit (IC) device during testing, wherein the thermal actuator is coupled to the IC device;

dynamically adjusting, by a thermal control interface of an automated test equipment (ATE) system, a target setpoint temperature for testing the IC device based on testing data for the IC device, wherein the ATE system is coupled to the IC device and is to send the testing data for the IC device to the thermal control interface during testing;

controlling, by a thermal controller, the temperature of the IC device during testing, the thermal controller including a dynamic thermal controller coupled to the thermal control interface and the thermal actuator to receive the target setpoint-temperature from the thermal control interface and control the. thermal actuator based on the target setpoint temperature.

8. The method of claim 7 further comprising coupling a digital interface between the thermal control interface and the dynamic thermal controller.

9. The method of claim 7 wherein the target setpoint temperature is received by the dynamic thermal controller from the dynamic thermal controller via the digital interface as part of a real time data stream.

10. The method of claim 7 wherein the dynamic thermal controller comprises a temperature control loop module to control the thermal actuator.

11. The method of claim 7 further comprising receiving, by the thermal control interface, feedback from the thermal actuator and transmitting, by the thermal control interface, the target setpoint temperature to the temperature control loop module.

12. The method of claim 7 wherein the dynamic thermal controller further comprises a control and mode select module to enable selection of a mode of operation.

* * * * *